United States Patent [19]

Sano

[11] Patent Number: 5,190,892
[45] Date of Patent: Mar. 2, 1993

[54] METHOD FOR FORMING PATTERN USING LIFT-OFF

[75] Inventor: Yoshiaki Sano, Tokyo, Japan

[73] Assignee: Oki Electric Industry Co., Ltd., Tokyo, Japan

[21] Appl. No.: 800,728

[22] Filed: Dec. 3, 1991

Related U.S. Application Data

[63] Continuation of Ser. No. 387,963, Aug. 1, 1989, abandoned.

[30] Foreign Application Priority Data

Aug. 11, 1988 [JP] Japan ................. 63-200358

[51] Int. Cl.⁵ .............................. H01L 21/44
[52] U.S. Cl. .................. 437/180; 437/228; 437/944; 148/DIG. 100
[58] Field of Search .......... 437/180, 944, 228; 148/DIG. 100, DIG. 912

[56] References Cited

U.S. PATENT DOCUMENTS 4,771,017  9/1988  Tobin et al. ................. 437/944

FOREIGN PATENT DOCUMENTS 61-8952  1/1986  Japan .

*Primary Examiner*—Brian E. Hearn
*Assistant Examiner*—Laura M. Holtzman
*Attorney, Agent, or Firm*—Wenderoth, Lind & Ponack

[57]  ABSTRACT

A method is for forming a pattern from a film which is deposited with a low directivity. A resist pattern is formed on a substrate. A first film is deposited with low directivity, and then a second film is deposited with high directivity. The first film is etched selectively using the second film as an etching mask. Then, the resist pattern is dissolved.

1 Claim, 4 Drawing Sheets

METHOD FOR FORMING PATTERN USING LIFT-OFF

This application is a continuation of now abandoned application, Ser. No. 07/387,963 filed on Aug. 1, 1989 now abandoned.

BACKGROUND OF THE INVENTION

1. Field of the Invention

This invention relates to a method for forming a pattern from a film which is deposited with low directivity.

2. Prior Art

Conventionally, refractory metal is employed in semiconductor devices. For example, W (tungsten) and W-Si (tungsten-silicide) are used for gate electrodes of FETs. W-N (tungsten-nitride) and Ta-N (tantalum-nitride) are used for thin film resistors.

Since the boiling point of the refractory metal is generally more than 5000° C., it is difficult to deposit the metal by resistive heating evaporation or electron beam evaporation. Therefore, sputtering or Chemical Vapor Deposition (CVD) is employed as a deposition process with low directivity.

A prior method for forming a pattern of refractory metal is illustrated in FIG. 4.

First, a W-Si film 13 is formed on a Si substrate 11 by sputtering (FIG. 4A). Next, a resist pattern 15 is formed on the W-Si film 13 using photolithography technology. Then, by Reactive Ion Etching (RIE) with SF6 gas, the W-Si film 13 is etched using the resist pattern 15 as an etching mask (FIG. 4B). Next, the resist pattern 15 is removed (FIG. 4).

However, according to the above prior art, unless the etching of the W-Si film 13 is stopped in a timely manner, the Si substrate 11 is etched.

Another prior art which overcomes the above problem is illustrated in FIG. 5.

First, a resist pattern 23 is formed on the Si substrate 21 using photolithography (FIG. 5A). To facilitate the subsequent lift-off process, the resist pattern 23 includes a portion which overhangs at a window 23a.

Next, a W-Si film 25 is formed on the resist pattern 23 and the Si substrate 21 by sputtering (FIG. 5B). Due to the overhangs, of the resist pattern W-Si 23 is not deposited on the upper areas of the side walls of the resist pattern 23.

Next, the above structure is soaked in a resist dissolver. The dissolving of the resist pattern 23 starts from the exposed areas where the W-Si is not deposited. As such, lift-off is performed to form the W-Si pattern 25a (FIG. 5C).

However, according to this prior art, method the exposed resist area tends to be small. Thus, a relatively large amount of time, is required to dissolve the resist pattern 23.

SUMMARY OF THE INVENTION

It is an object of the present invention to provide a method for forming a pattern which facilitates lift-off.

Another object of the present invention is to provide a method for forming a pattern where measurements of the pattern are accurately controllable.

The above and other objects, features and advantages of the present invention will become more apparent from the following description when taken in conjunction with the accompanying drawings in which a preferred embodiment of the present invention is shown by way of illustrated example.

DESCRIPTION OF THE PREFERRED EMBODIMENT

A first embodiment according to the present invention is illustrated in FIG. 1.

Figure 1A:
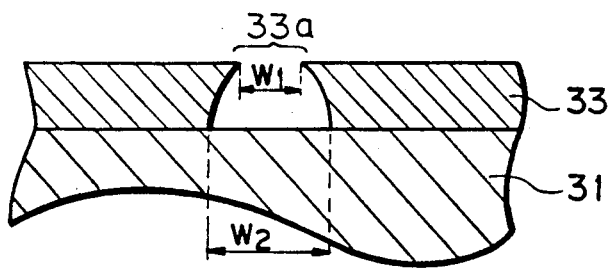
FIGS. 1A–1E are schematic sectional views of a first embodiment according to the present invention.

First, a resist pattern 33 is formed on a substrate 31 using conventional photolithography. Substrate 31 may consist of a single layer or plural layers. The resist pattern 33 defines a window 33a where the substrate 31 is exposed. As shown in FIG. 1A, the resist pattern 33 overhangs at the window 33a. Therefore, top width W1 of the window 33a is narrower than its bottom width W2.

Figure 1B:
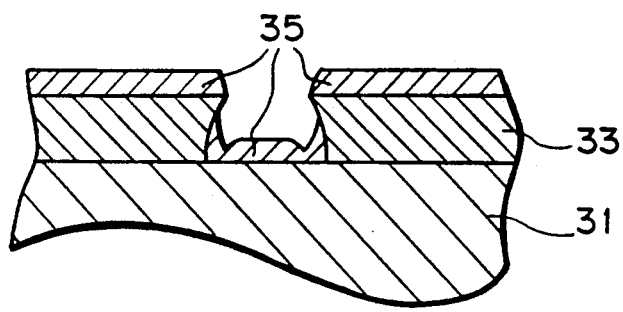

Next, as shown in FIG. 1B, a first film 35 is formed on the resist pattern 33 and substrate 31. Refractory metal, for example W-Si, is employed as the first film 35. In order to deposit the refractory metal with low directivity, sputtering or CVD may be employed.

Figure 1C:
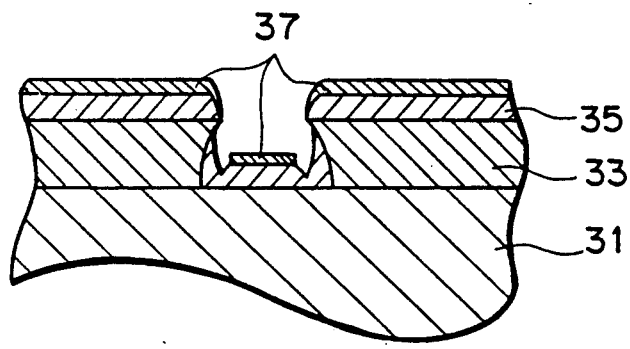

Next, as shown in FIG. 1C, a second film 37 is formed on the first film 35. For example, Al (Aluminum) is employed for as the second film 37. In order to deposit the Al with high directivity, resistive heating evaporation or electron beam evaporation may be employed.

Figure 1D:
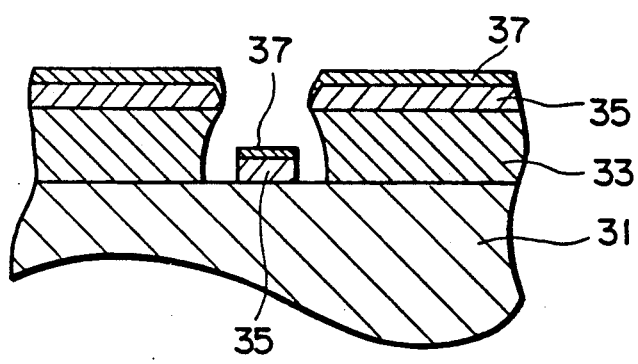

Next, as shown in FIG. 1D, the first film 35 is selectively etched by RIE or wet etching, for example. The second film 37 functions as the etching mask. The etching is stopped when the substrate 31 becomes exposed. As a result, the side walls of the resist pattern 33 at window 33a become exposed.

Then, the above structure is soaked in a resist dissolver. Since the entire surfaces of the side walls of the resist pattern 33 are exposed, the resist dissolution proceeds more quickly than in the prior art method. Thus, lift-off of the first and second film 35 and 37 on the resist is relatively easy.

Figure 1E:
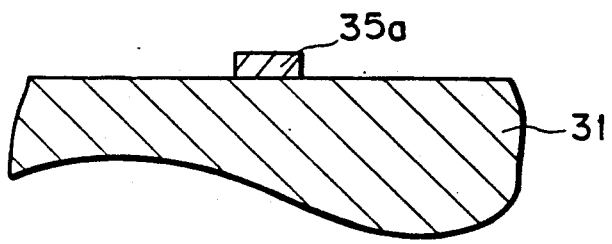

Next, as shown in FIG. 1E, the second film 37 left on the first film 35 is removed using HCl, for example. Then, the pattern 35a of the first film is obtained. Since the edges of the pattern 35a are selectively etched in the above process, a surface of pattern 35a is flat.

The removing of the second film 37 may be performed before the lift-off process.

According to the first embodiment, as described above, necessary the time required for the lift-off process is shortened. Further, since the width of the pattern 35a agrees substantially with the top width W1 of the window 33a, controlling measurements of the pattern 35a is made easier.

A second embodiment of the present invention is described below.

The second embodiment entails the same processes as shown in FIG. 1A–1C, and is different from the first embodiment with respect to the amount of etching of the first film 35.

Figure 2A:
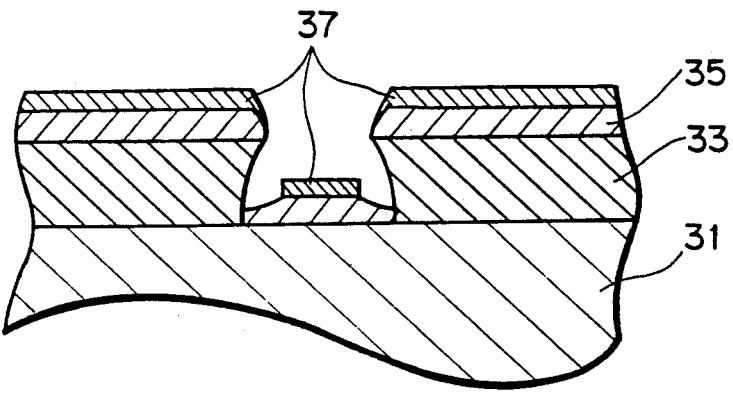
FIGS. 2A–2B are schematic sectional views of a second embodiment according to the present invention.

As shown in FIG. 2A, the first film 35 is etched with using the second film 37 as the etching mask. However, the etching process is stopped prior to exposure of the substrate 31, but not before the side walls of resist pattern 33 are sufficiently exposed for the lift-off process.

Figure 2B:
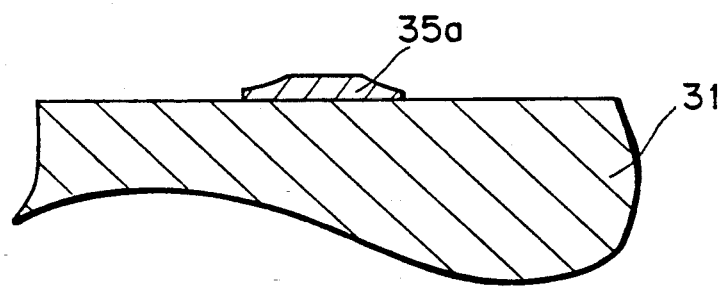

The lift-off is performed as shown in FIG. 2B, and the second film 37 is subsequently removed. Thus, the pattern 35a of the first film is obtained.

According to the second embodiment, the substrate 31 is not exposed to plasma of the RIE. Therefore, etching of the substrate 31 is avoided.

A third embodiment of the present invention is described with reference to FIG. 3.

Figure 3A:
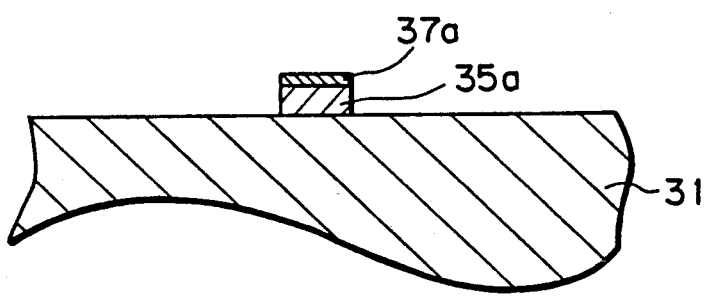
FIGS. 3A–3B are schematic sectional views of a third embodiment according to the present invention.
Figure 3B:
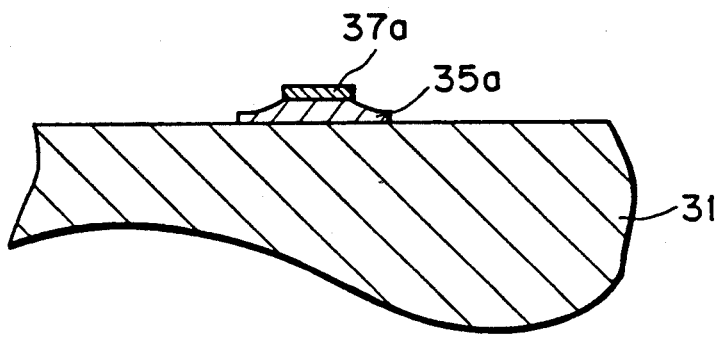
Figure 4A:
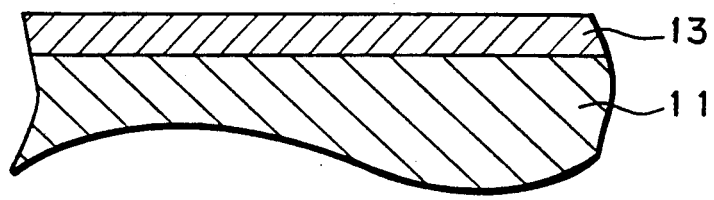
FIGS. 4A–4C are schematic sectional views of a prior art method.
Figure 4B:
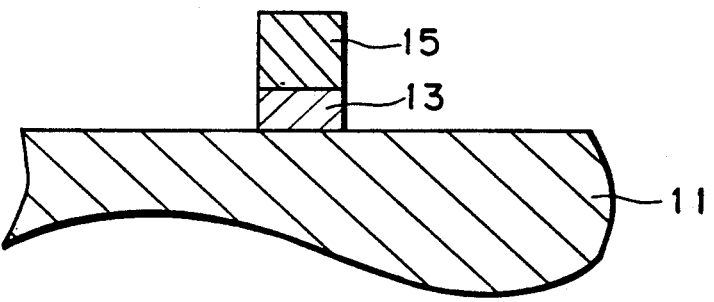
Figure 4C:
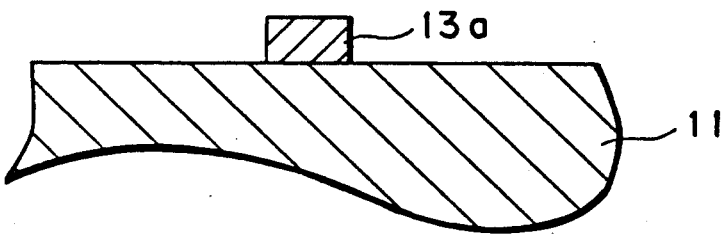
Figure 5A:
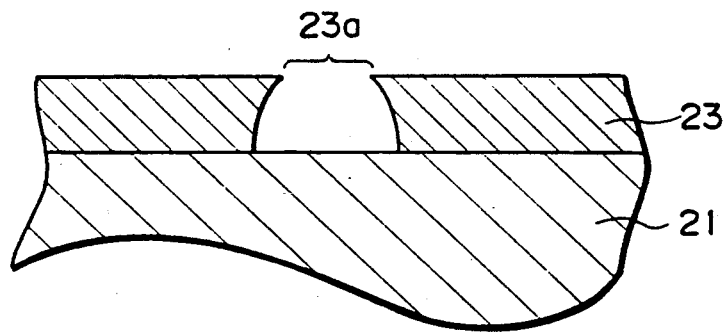
FIGS. 5A–5C are schematic sectional views of another prior art method.
Figure 5B:
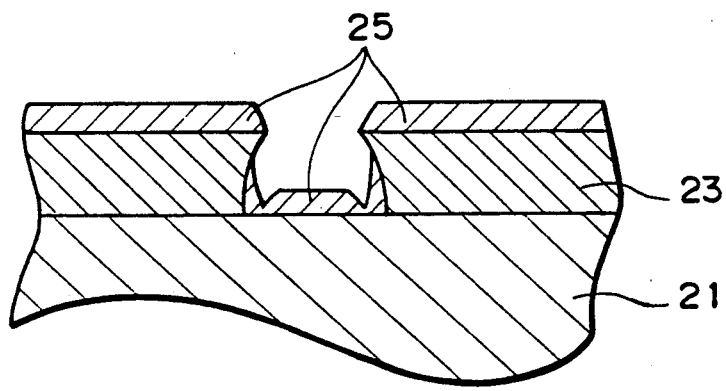
Figure 5C:
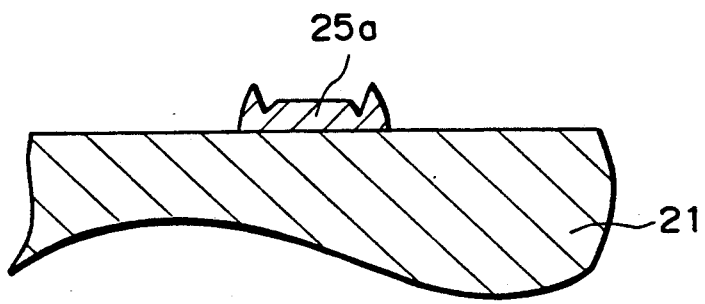

FIGS. 3A and B illustrate modifications of the first and second embodiments. As shown in these figures, the second film 37a remains disposed on the first film pattern 35a.

According the third embodiment, a pattern that consists of plural layers is formed.

What is claimed is:

1. A method of forming a pattern which comprises the steps of:

forming a resist pattern on a substrate to obtain a first structure, said resist pattern having a window opening and having portions overhanging said window opening;

forming a first film on said first structure using a deposition process of a low directivity to obtain a second structure, said first film consisting of a refractory metal;

forming a second film on said second structure using a deposition process of a high directivity;

etching said first film selectively using said second film as an etching mask; and, dissolving said resist pattern after said etching step;

wherein said process of a low directivity is a sputtering process or a chemical vapor deposition process and wherein said process of a high directivity is a resistive heating evaporation process or an electron beam evaporation process.

* * * * *